(12) United States Patent
Lara

(10) Patent No.: US 6,757,634 B2
(45) Date of Patent: Jun. 29, 2004

(54) METHODS AND STRUCTURE FOR MAINTAINING STATE INFORMATION TO RESUME AUTOMATED TEST PROCESSING AFTER RESET

(75) Inventor: John M. Lara, Wichita, KS (US)

(73) Assignee: LSI Logic Corporation, Milpitas, CA (US)

( * ) Notice: Subject to any disclaimer, the term of this patent is extended or adjusted under 35 U.S.C. 154(b) by 59 days.

(21) Appl. No.: 10/166,513

(22) Filed: Jun. 10, 2002

(65) Prior Publication Data

US 2003/0229467 A1 Dec. 11, 2003

(51) Int. Cl.$^7$ .......................... G01R 31/00; G01R 31/14
(52) U.S. Cl. ...................................................... 702/119
(58) Field of Search ...................... 702/117–119, 123, 702/182–185; 714/30, 36, 47

(56) References Cited

U.S. PATENT DOCUMENTS 6,467,054 B1 * 10/2002 Lenny ........................ 714/42
6,530,052 B1 * 3/2003 Khou et al. ................. 714/733

* cited by examiner

Primary Examiner—Michael Nghiem
(74) Attorney, Agent, or Firm—Duft Setter Ollila & Bornsen LLC

(57) ABSTRACT

Methods and associated structure for saving and restoration of state information regarding progress of an automated test procedure to permit resumption of the automated test procedure following reset or failure of the automated test system. An automated test system in accordance with the present invention preferably saves state information in a non-volatile storage medium, such as a disk file, indicative of the progress of the test procedure. When the test system environment in which the automated test system is operable is reset or restarted, intentionally or due to failure, the automated test system retrieves previously saved state information from the non-volatile storage medium to resume the automated test process in accordance with the saved state information.

19 Claims, 3 Drawing Sheets

METHODS AND STRUCTURE FOR MAINTAINING STATE INFORMATION TO RESUME AUTOMATED TEST PROCESSING AFTER RESET

BACKGROUND OF THE INVENTION

1. Field of the Invention

The invention relates generally toe to automated test systems and more specifically to methods and structures for saving and restoring state information during processing of automated test procedures to permit restart of an automated test procedure in accordance with the same state information.

2. Discussion of Related Art

In the design and manufacturer of electronic and computing systems (as well as other products and systems) it is generally known to provide automated test systems to automatically verify proper operation of the product or process (i.e., the "system under test"). Such an automated test system responds to sequences of directives and commands supplied by a test operator to generate and apply desired stimuli to the system under test and to verify proper operation of the system under test in response to application of the generated stimuli. The desired stimuli may be manually generated through human interaction and intervention or may be automatically generated by programmable interaction between the automated test system and the system under test.

It is frequently the case that an automated test system comprises computer programs operable on the same system environment in which the system under test operates. In such a test environment, it is a particular problem that the system under test may be reset or restarted in the performance of a particular desired lest sequence or for other reasons outside control of the automated test system. When the system on which the automated test system is operable is so restarted or reset, the automated test system as presently practiced in the art will be reset such that the entire sequence of test procedures maybe restarted from the beginning. Where a sequence of test procedures may be lengthy, restarting the test procedures from the beginning may be an undesirable aspect of such a test environment.

In a particular example of such a test environment, an automated test application program may be operable on a host computer system along with management software portions of a storage control and management subsystem operable on the same system environment. Testing of such a storage management subsystem may require periodic reset and restart of the storage management control features operable on the host environment. Reset and restart of such a system under test would also cause a reset and restart of the automated test application portion co-resident and co-operable on the same host system.

It is evident from the above discussion that a need exists for an improved automated test system design that permits reset and restart of an automated test procedure without necessarily starting the test sequence from the beginning.

SUMMARY OF THE INVENTION

The present invention solves the above and other problems, thereby advancing the state of the useful arts, by providing methods and associated structure for storing the state of an automated test system to enable resumption of automated test procedures in accordance with the saved state information. More specifically, an automated test system in accordance with the present invention periodically stores state information regarding completion and success or failure of individual test cases as the test process sequences through multiple such test cases. In one exemplary preferred embodiment, such state information is stored in a non-volatile storage medium such that the information is not lost if the host environment for the automated test application is reset or restarted.

Still more specifically in one exemplary preferred embodiment, an automated test procedure may be defined in terms of one or more scripts of interpretive commands processed by the automated test system application. Each script may comprise a number of test cases each of which, in turn, may comprise sequential steps performing particular individual test cases as part of a sequence of tests defined by a particular script. Dependencies among the various test cases within scripts and among the various scripts may be maintained in the non-volatile memory element as well as periodically updated state information indicating the progress of the automated test system application through the various test cases of each script and through the various scripts comprising the entire automated test procedure.

A first feature of the invention therefore provides an automated test system including: an automated test system application operable on a host system; and a non-volatile memory component coupled to the host system such that the automated test system application is operable to store state information on the non-volatile memory component indicative of progress in a present test procedure such that the automated test system may be resumed in accordance with the state information.

Another aspect of the invention further provides for a task scheduler component operable on the host system to retrieve the state information from the non-volatile memory component in response to restart of the host system.

Another aspect of the invention further provides for a system under test application operable on the host system and communicatively coupled with the automated test system application such that the automated test system application is operable to verify operation of the system under test application.

Another aspect of the invention further provides for a system under test communicatively coupled with the system under test application.

Another aspect of the invention further provides that the system under test is a storage subsystem and that the system under test application is a storage management application program.

Another aspect of the invention further provides that the state information includes: a test completion flag indicating completion of an associated test case.

Another aspect of the invention further provides that the state information includes: a test success flag indicating passage of an associated test case.

A second feature of the invention provides for a method for automated testing of a system under test comprising the steps of: initiating an automated test procedure to test the system under test; and periodically recording in a non-volatile memory device state information indicative of progress of the automated test procedure.

Another aspect of the invention further provides for the step of resuming the automated test procedure in accordance with the state information such that the resumption of the automated test procedure is in response to reset of a host system on which the method is operating.

Another aspect of the invention further provides that the automated test procedure is comprised of a plurality of test cases and such that the state information includes information indicating completion state of the plurality of test cases and such that the step of resuming includes the step of: continuing the automated test procedure with test cases of the plurality of test cases for which the completion state is not recorded in the state information.

Another aspect of the invention further provides the step of: providing test case dependency information indicating dependencies among the plurality of test cases such that a test case may only be performed when all other test cases on which it depends are successfully completed, such that the step of continuing includes the step of: continuing the automated test procedure with test cases for which all dependency information is satisfied.

Another aspect of the invention further provides that the automated test procedure is comprised of a plurality of test cases and such that the step of periodically recording comprises the step of: recording completion state at the completion of each of the plurality of test cases.

Another aspect of the invention further provides that the automated test procedure is comprised of a plurality of test cases and such that the step of periodically recording comprises the step of: recording successful completion state at the successful completion of each of the plurality of test cases.

Anther aspect of the invention further provides that the automated test procedure is comprised of a plurality of test cases and such that the step of periodically recording comprises the steps of: recording successful completion state at the successful completion of each of the plurality of test cases; and recording unsuccessful completion state at the unsuccessful completion of any of the plurality of test cases.

DETAILED DESCRIPTION OF THE PREFERRED EMBODIMENTS

Figure 1:
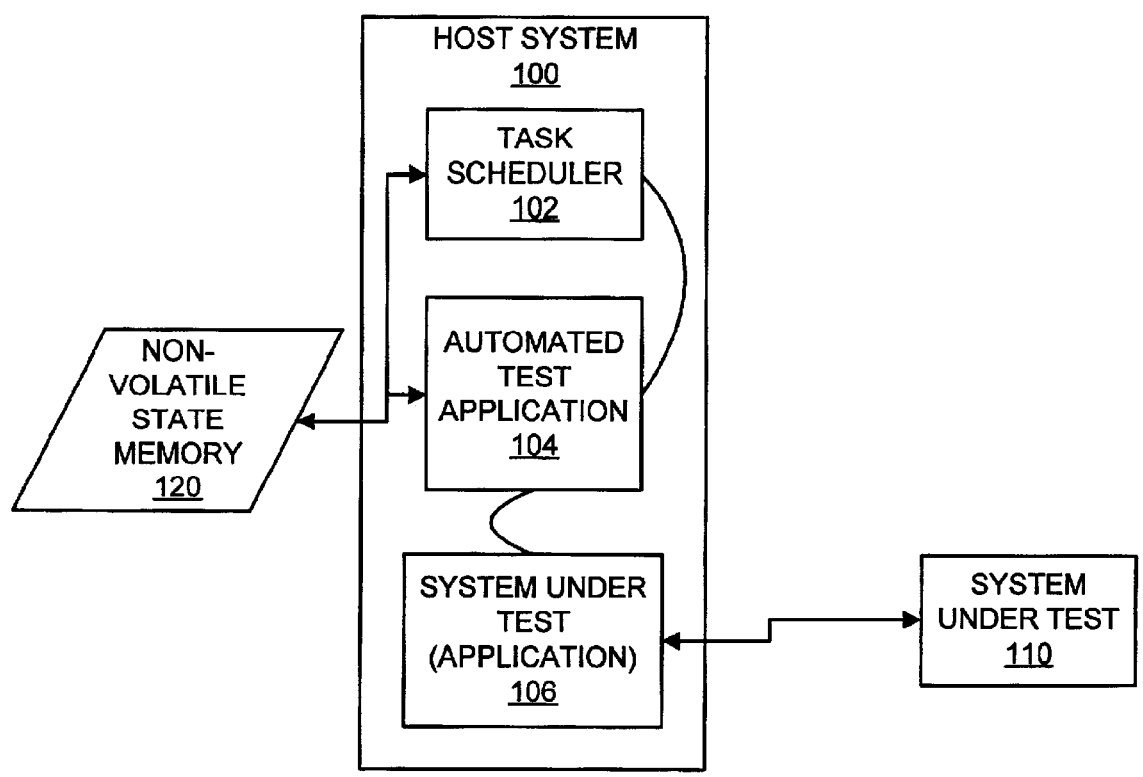
FIG. 1 is a block diagram depicting an automated test system operable to test a system under test in accordance with the present invention.

While the invention is susceptible to various modifications and alternative forms, a specific embodiment thereof has been shown by way of example in the drawings and will herein be described in detail. It should be understood, however, that it is not intended to limit the invention to the particular form disclosed, but on the contrary, the invention is to cover all modifications, equivalents, and alternatives falling within the spirit and scope of the invention as defined by the appended claims.

FIG. 1 is a block diagram showing an automated test system operable in accordance with the present invention. The exemplary test system depicted is co-resident on a host system 100 with a system under test application 106. Host system 100 may be any good programmable system such as a personal computer, workstation or other general purpose or special purpose computing device. In particular, an automated test application 104 performs desired test cases as and when instructed to do so by task scheduler 102. As required, automated test application 104 communicates with system under test application 106 to effectuate desired steps and sequences in performance of each test case. System under test application 106 may be communicatively coupled with a system under test hardware component 110 external to host system 100 as appropriate to the particular environment and application.

In one exemplary preferred embodiment, system under test 110 may be a data storage subsystem used for storage and retrieval of user data. System under test application 106 is therefore a programmable component operable within host system 100 to control and manage operation of storage subsystem 110 (system under test 110).

In a preferred embodiment of the present invention, automated test application 104 records information in a non-volatile state memory 120 indicating status regarding progress of each particular test case of an automated test procedure. The task scheduler 102 is also communicatively coupled with non-volatile state memory 120 to retrieve state information stored by automated test application 104 in the processing of individual test cases. Preferably, automated test application 104 records a status indicator when each particular test case is completed. The completion indicator may also include success or failure indication corresponding to success or failure in performance of the corresponding test case. Other state and related information may be stored in non-volatile state memory 120 as automated test application 104 progresses through performance of selected test cases. Examples of other such information may include time and date stamp information, test operator identification information, etc.

Those of ordinary skill in the art will recognize that non-volatile state memory 120 may be any of several well-known non-volatile storage media including, for example, magnetic and optical storage media as well as non-volatile semiconductor memory components.

If host system 100 is reset or restarted (either intentionally or due to system failure), task scheduler 102 may retrieve state information previously stored in nonvolatile state memory 120 to provide for resumption of a previously operating test process rather than requiring restart of a potentially lengthy test procedure. Host system 100 may be reset for various reasons including, for example inadvertent reset due to system failure as well as intended reset operations associated with performance of particular test sequences.

Those of ordinary skill in the art will readily recognize that FIG. 1 is merely intended as representative of one exemplary structure of a host system on which an automated test process may operate in accordance with the present invention. In particular, for example, those of ordinary skill in the art will recognize that the automated test system (including for example task scheduler 102 and automated test application 104) may reside on a separate host system from that in which the system under test application 106 is operable. When the automated test system and system under test application happened to be co-resident on the same host system, the problem of possible reset and restart of such a host system is more acute and common.

Figure 2:
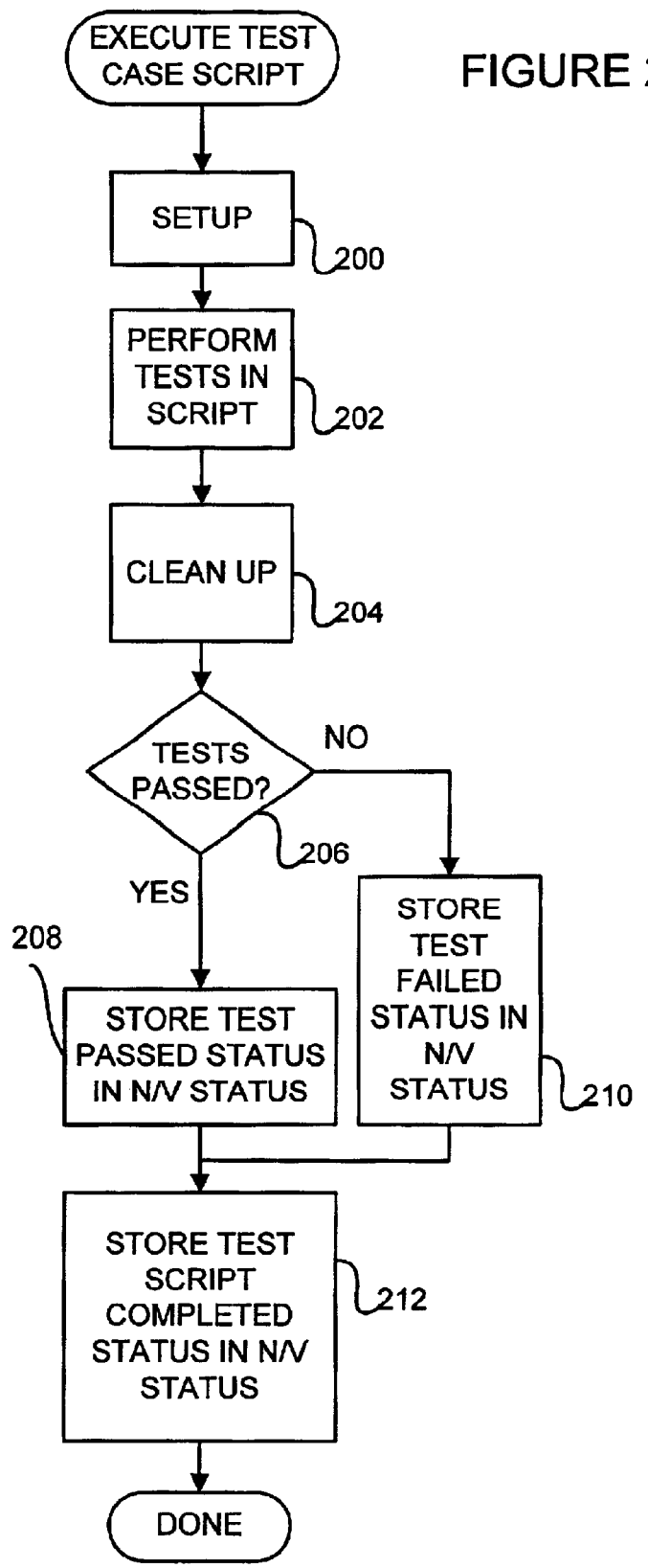
FIG. 2 is a flowchart describing operation of a sequence for processing an individual test case script in accordance with the present invention.
Figure 3:
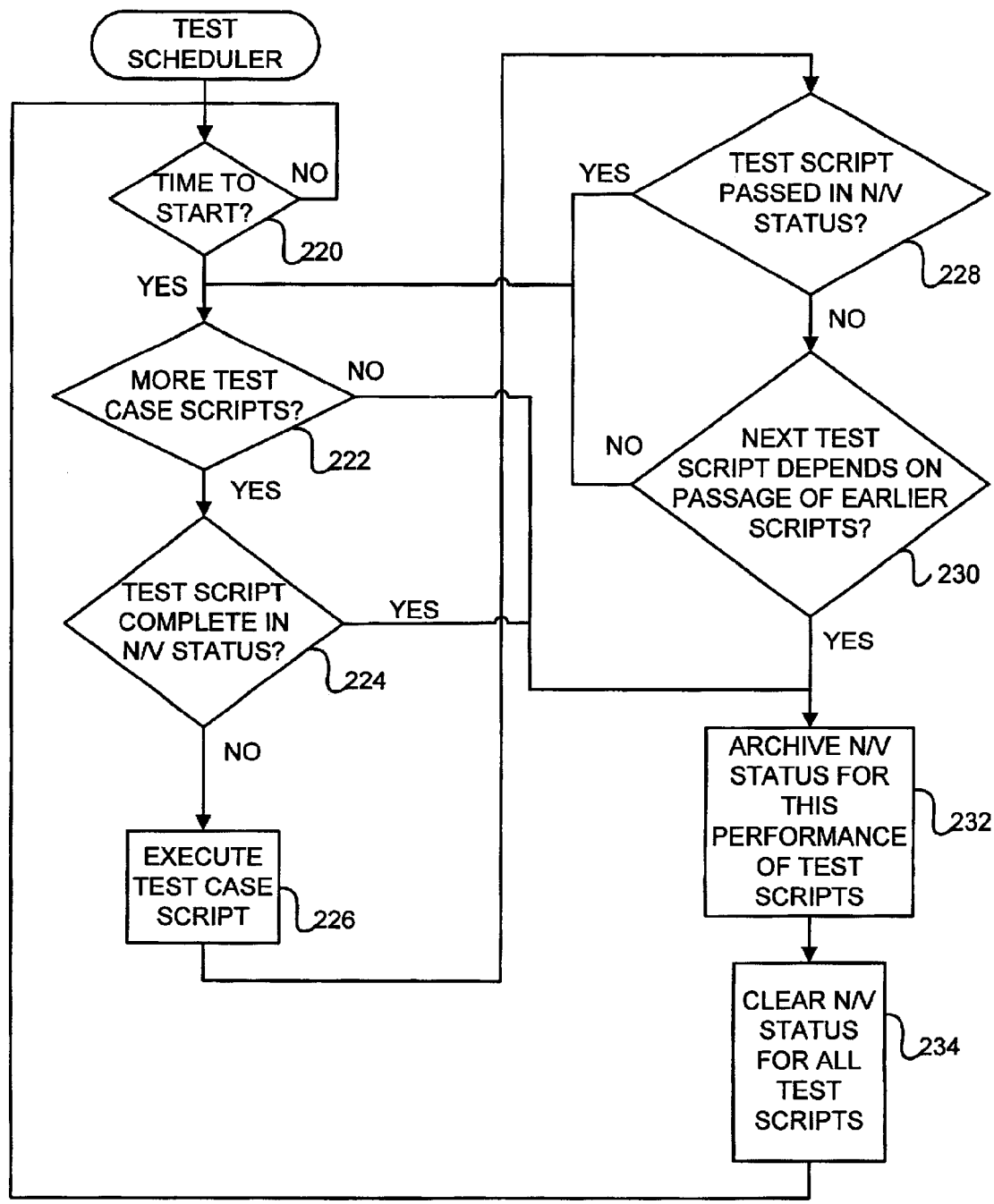
FIG. 3 is a flowchart describing operations of the task scheduler component in accordance with the present invention.

FIGS. 2 and 3 provide flowcharts describing operation of task scheduler component 102 and automated test application 104 as shown in FIG. 1. In general, task scheduler controls overall operation and sequencing of the automated test system to perform desired test sequences in an appropriate order and at the appropriate time.

As noted elsewhere herein, in an exemplary preferred embodiment, the automated test system performs desired test operations in accordance with commands provided by the test operator. Preferably, such commands are encoded as interpretive commands in a scripting language. Task scheduler 102 and automated test application 104 therefore reads and interprets such sequences of test commands provided by a test operator to perform the desired test sequences in the desired order.

Elements 220 through 234 of FIG. 3 describe operation of task scheduler elements 102 of FIG. 1. Element 220 is first operable to await the desired time to start the next test procedure. Until the desired start time arrives, element 220 continues looping. When the appropriate time arrives, element 222 is next operable to determine if more interpretive scripts are available to be processed to accomplish the specified, desired automated test sequences. If not, processing continues at element 232 as described below to archive the completion of the present test procedure.

If additional test scripts remain available to be processed as determined by element 222, processing continues at element 224 to inspect previously recorded state information in the non-volatile memory to determine whether the present test script to be run was previously run successfully prior to interruption or reset of the host system in which the automated test system is operating. If element 224 determines that the currently selected test script was completed as indicated by the status in non-volatile memory, processing continues below with element 228. If the test was not previously completed prior to interruption of the test procedure, element 226 is next operable to execute the desired test script and recording the results of that test script in the non-volatile memory. Additional details of such processing are provided herein further below.

Whether the selected test script was previously completed or is presently rerun by processing of elements 224 and 226 as above, element 228 is next operable to determine whether the most recent execution of the selected test script passed or failed as indicated by further status recorded in the non-volatile memory. If the status recorded in non-volatile memory indicates that the test succeeded, processing continues by looping back to element 222 to process additional test scripts associated with the presently executing test procedure. If element 228 determines that the most recent performance of the selected test script indicates a failure status, element 230 is next operable to determine whether the next test script to be selected depends on passage of earlier performed test scripts. Configuration information associated with the test procedures and/or with individual test cases or test scripts preferably indicates whether a particular test is dependent upon another test to be successfully performed first. If the next test script to be performed is not dependent on successful completion of an earlier test script, processing continues by looping back to element 222 to process further test scripts associated with the presently executing test procedure.

When all test cases of all test scripts of the presently executing test procedure have completed or cannot proceed because of a dependency on a failed test case, elements 232 and 234 complete processing of the presently executing test procedure. In particular, element 232 transfers information presently stored in the non-volatile memory into an archive storage medium for later analysis by the test operator. The archive stores all information required by the test operator to evaluate the success or failure of the test procedure corresponding to the archived state information. Element 234 then clears the non-volatile memory of all state information now successfully archived. This archival process permits subsequent test procedures to be commenced without erasing previously recorded historical information regarding other test procedures. Processing then continues by looping back to element 220 to await an appropriate time for starting a next test procedure.

Elements 200 through 212 of FIG. 2 describe operation of a method of the present invention to process a single test case script as noted above in element 226. Element 200 is first operable to setup the test environment to perform the desired test case script. Variables of the test case processor are initialized as needed and as generally known in the art. Element 202 then performs each of the individual test cases in the selected test script. As noted above, a test script may define a sequence of test cases to be performed in a defined order to test particular features. Element 204 next cleans up the test environment after completion of the test case(s) defined by the test case script.

Element 206 then determines whether the test cases that ran by processing of element 202 passed or failed. Pass status and failed status are recorded in the nonvolatile memory by elements 208 and 210, respectively. Lastly, element 212 records in the non-volatile memory that the test case script was run to completion. This information recorded in the non-volatile memory may then be utilized as discussed herein above by the test scheduler to determine where the previous test process left off if the process is interrupted prior to completion of all test cases in all test case scripts.

Those of ordinary skill in the art will readily recognize that the flowcharts of FIGS. 2 and 3 are intended merely as one exemplary embodiment of automated test system processing that saves and restores state information in a non-volatile memory in accordance with the present invention. Numerous other equivalent procedures will be readily apparent to those of ordinary skill in the art for performing this function. In particular, those of ordinary skill in the art will readily recognize that the task scheduler processing and test case execution may be integrated as a single method rather than two distinct methods as depicted in the separate flowcharts of FIGS. 2 and 3. Further, those of ordinary skill in the art will recognize a variety of other forms of state information that may be useful for recordation in the non-volatile memory component. Lastly, in an exemplary preferred embodiment as presented above, a test procedure is composed of one or more test scripts each of which is composed of one or more individual test cases. Those of ordinary skill in the art will recognize that an automated test system may perform the desired automated test process without such a hierarchical definition of test procedures, scripts and test cases. The described relationship between test cases, test scripts and test procedures is but one exemplary decomposition of the automated test system processing. Numerous other equivalent structures and techniques will be readily apparent to those of ordinary skill in the art.

While the invention has been illustrated and described in the drawings and foregoing description, such illustration and description is to be considered as exemplary and not restrictive in character, it being understood that only the preferred embodiment and minor variants thereof have been shown and described and that all changes and modifications that come within the spirit of the invention are desired to be protected.

What is claimed is:

1. An automated test system including:
    an automated test system application operable on a host system; and
    a non-volatile memory component coupled to said host system wherein said automated test system application is operable to store state information on said non-volatile memory component indicative of progress in a present test procedure such that said automated test system may be resumed in accordance with said state information,
    wherein the automated test system is adapted to retrieve the stored state information from the non-volatile memory component to resume operation of the automated test system in response to restart of the host system.

2. The automated teat system of claim 1 further comprising:
   a task scheduler component operable on said host system and associated with the automated test system application to retrieve said state information from said nonvolatile memory component in response to restart of said host system.

3. The automated test system of claim 1 further comprising:
   a system under test application operable on said host system and communicatively coupled with said automated test system application wherein said automated test system application is operable to verify operation of said system under test application.

4. The automated test system of claim 3 further comprising:
   a system under test communicatively coupled with said system under test application.

5. The automated test system of claim 4 wherein said system under test is a storage subsystem and wherein said system under test application is a storage management application program.

6. The automated test system of claim 1 wherein said state information includes:
   a test completion flag indicating completion of an associated test case.

7. The automated test system of claim 1 wherein said state information includes:
   a test success flag indicating passage of an associated test case.

8. A method for automated testing of a system under test comprising the steps of:
   initiating an automated test procedure to test said system under test;
   periodically recording in a non-volatile memory device state information indicative of progress of said automated test procedure; and
   resuming said automated test procedure in accordance with said state information wherein the resumption of said automated test procedure is in response to reset of a host system on which the method is operating.

9. The method of claim 8 wherein said automated test procedure is comprised of a plurality of test cases and wherein said state information includes information indicating completion state of said plurality of test cases and wherein the step of resuming includes the step of:
   continuing said automated test procedure with test cases of said plurality of test cases for which said completion state is not recorded in said state information.

10. The method of claim 9 further comprising the step of:
    providing test case dependency information indicating dependencies among said plurality of test cases such that a test case may only be performed when all other test cases on which it depends are successfully completed,
    wherein the step of continuing includes the step of:
       continuing said automated test procedure with test cases for which all dependency information is satisfied.

11. The method of claim 8 wherein said automated test procedure is comprised of a plurality of test cases and wherein the step of periodically recording comprises the step of:
    recording completion state at the completion of each of said plurality of test cases.

12. The method of claim 8 wherein said automated test procedure is comprised of a plurality of test cases and wherein the atop of periodically recording comprises the step of:
    recording successful completion state at the successful completion of each of said plurality of test cases.

13. The method of claim 8 wherein said automated test procedure is comprised of a plurality of test cases and wherein the step of periodically recording comprises the steps of:
    recording successful completion state at the successful completion of each of said plurality of test cases; and
    recording unsuccessful completion state at the unsuccessful completion of any of said plurality of test cases.

14. A system for automated testing of a system under test comprising:
    means for initiating an automated test procedure to test said system under test; means, associated with said means for initiating said automated test procedure, for periodically recording in a non-volatile memory device state information indicative of progress of said automated test procedure; and
    means for resuming said automated test procedure in accordance with said state information wherein the resumption of said automated test procedure is in response to reset of a host system on which the system is operating.

15. The system of claim 14 wherein said automated test procedure is comprised of a plurality of test cases and wherein said state information includes information indicating completion state of said plurality of test cases and wherein the means for resuming includes:
    means for continuing said automated test procedure with test cases of said plurality of test cases for which said completion state is not recorded in said state information.

16. The system of claim 15 further comprising:
    means for providing test case dependency information indicating dependencies among said plurality of test cases such that a test case may only be performed when all other test cases on which it depends are successfully completed,
    wherein the means for continuing includes:
       means for continuing said automated test procedure with test cases for which all dependency information is satisfied.

17. The system of claim 14 wherein said automated test procedure is comprised of a plurality of test cases and wherein the means for periodically recording comprises:
    means for recording completion state at the completion of each of said plurality of test cases.

18. The system of claim 14 wherein said automated test procedure is comprised of a plurality of test cases and wherein the means for periodically recording comprises:
    means for recording successful completion state at the successful completion of each of said plurality of test cases.

19. The system of claim 14 wherein said automated test procedure is comprised of a plurality of test cases and wherein the means for periodically recording comprises:
    means for recording successful completion state at the successful completion of each of said plurality of test cases; and
    means for recording unsuccessful completion state at the unsuccessful completion of any of said plurality of test cases.

* * * * *